United States Patent
Kotaka

(10) Patent No.: US 6,791,110 B2
(45) Date of Patent: Sep. 14, 2004

(54) SEMICONDUCTOR-PACKAGE MEASURING METHOD, MEASURING SOCKET, AND SEMICONDUCTOR PACKAGE

(75) Inventor: Akio Kotaka, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/334,716

(22) Filed: Jan. 2, 2003

(65) Prior Publication Data

US 2003/0100139 A1 May 29, 2003

Related U.S. Application Data

(62) Division of application No. 09/793,607, filed on Feb. 27, 2001, now Pat. No. 6,541,289.

(30) Foreign Application Priority Data

Aug. 3, 2000 (JP) ........................................ 2000-235543

(51) Int. Cl.$^7$ .............................................. H01L 23/58
(52) U.S. Cl. ...................... 257/48; 257/666; 257/678; 257/684; 257/690; 257/692; 257/693; 257/698
(58) Field of Search ........................ 257/48, 684, 678, 257/690, 692–693, 698, 666

(56) References Cited

U.S. PATENT DOCUMENTS

| | | | | |
|---|---|---|---|---|
| 4,722,060 A | * | 1/1988 | Quinn et al. ................... 716/19 |
| 4,846,704 A | * | 7/1989 | Ikeya ........................... 439/72 |
| 4,920,074 A | * | 4/1990 | Shimizu et al. ............... 29/827 |
| 5,432,680 A | * | 7/1995 | Tsuchida et al. ............ 361/776 |
| 5,461,258 A | * | 10/1995 | Ideta et al. .................. 257/723 |
| 5,508,563 A | * | 4/1996 | Tazawa et al. .............. 257/773 |
| 5,531,860 A | * | 7/1996 | Li ............................... 29/827 |
| 5,666,064 A | * | 9/1997 | Kasai et al. ................. 324/755 |
| 5,683,262 A | * | 11/1997 | Matsuoka et al. .......... 439/266 |
| 5,882,221 A | * | 3/1999 | Nguyen et al. ............. 439/331 |
| 5,908,324 A | * | 6/1999 | Ohshima et al. ............ 439/266 |
| 6,045,382 A | * | 4/2000 | Tohyama et al. ........... 439/266 |
| 6,065,986 A | * | 5/2000 | Mizuta ....................... 439/266 |
| 6,281,570 B1 | * | 8/2001 | Kameyama et al. ........ 257/697 |
| 6,303,985 B1 | * | 10/2001 | Larson et al. ............... 257/676 |
| 6,362,642 B1 | * | 3/2002 | Farnworth ................... 324/765 |
| 2002/0074147 A1 | * | 6/2002 | Tan et al. ................... 174/52.4 |
| 2002/0074638 A1 | * | 6/2002 | Liao et al. .................. 257/686 |

* cited by examiner

Primary Examiner—Amir Zarabian
Assistant Examiner—Ida M. Soward
(74) Attorney, Agent, or Firm—Rabin & Berdo, P.C.

(57) ABSTRACT

Electrical connection of a measuring socket to an IC package, to measure electrical characteristics of the IC package, is realized by bringing a measuring pin of a measuring arm of the measuring socket into contact with an end surface of a distal end of a lead of the IC package. Accordingly, a problem of solder plated to the lead becoming attached to and deposited on an upper side of a socket pin and shaved off by the distal end of the lead, and thereby producing solder residue, is solved. This problem occurs when electrical connection to an IC package is conventionally realized by bringing the distal end of the lead of the IC package into contact with a distal end of the socket pin.

12 Claims, 7 Drawing Sheets

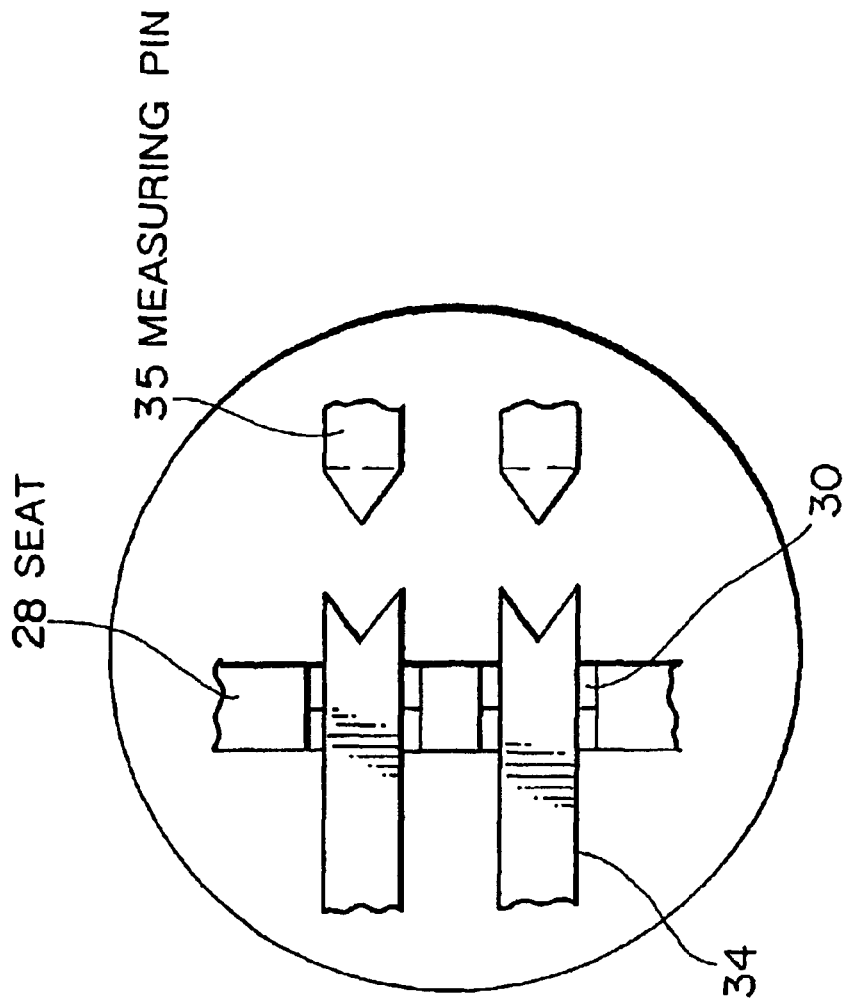
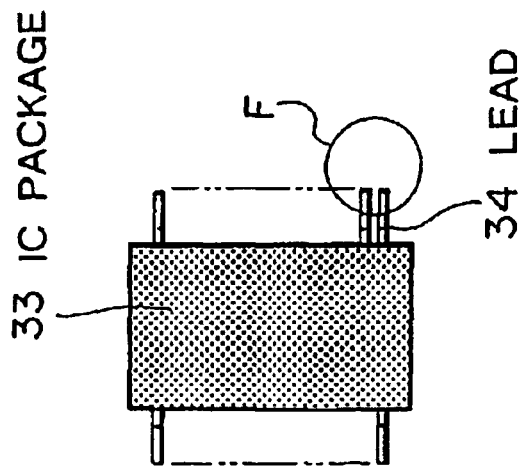

SEMICONDUCTOR-PACKAGE MEASURING METHOD, MEASURING SOCKET, AND SEMICONDUCTOR PACKAGE

This is a Divisional of U.S. application Ser. No.: 09/793,607, filed Feb. 27, 2001 now U.S. Pat. No. 6,541,289, the subject matter of which is hereby incorporated by reference.

BACKGROUND OF THE INVENTION

1. Field of the Invention

The present invention relates to a semiconductor-package measuring method for testing electrical characteristics of a semiconductor package by setting the semiconductor package individually into a measuring socket in the semiconductor-package inspecting step, to a measuring socket of a semiconductor package, and to a semiconductor package to be tested.

2. Description of the Related Art

Conventionally, the inspecting step of testing an IC package, which has been formed into an individual piece by molding the IC package onto a lead frame with a mold resin and then soldering the package onto the surface of the lead frame and lead-working the package, has been manually executed or automatically executed while the IC package was automatically carried. The inspecting step described below is automatically executed.

FIG. 7 is a view showing a conventional IC-package measuring method, and is a schematic sectional view of a measuring device viewed from a side thereof.

A test tray 2 mounting an IC package 1 is transported by a not-illustrated transporting mechanism and the IC package 1 is set to an inspection position at which a socket 3 is disposed. In this case, the IC package 1 is positioned to a position at which the distal end of a lead 4 of the IC package 1 contacts the distal end of a conductive socket pin 5 of the socket 3.

Then, a lead-holding portion 7 made of an insulator and provided for a lead holding mechanism 6 of the measuring device lowers from the upper side to lower the test tray 2 simultaneously with the IC package 1 and bring the distal end of the lead 4 of the IC package 1 into contact with an upper surface of the distal end of the socket pin 5.

The lead holding mechanism 6 stops at a position where the mechanism 6 contacts a stopper 8 of a lead holder provided for the socket 3. Thereby, the lead holding portion 7 stops at a position further down by a certain distance from a position where the portion 7 contacted the lead 4 of the IC package 1. A stroke of the lead holding mechanism 6 from a position at which the lead holding portion 7 contacts the inserted lead 4 of the IC package 1 to the stopper 8 is referred to as socket pushing distance B.

In this case, the lead 4 and socket pin 5 move from the position shown by a continuous line to the position shown by an alternate-long-and-short-dash line and the lead 4, socket pin 5, a conductive portion of the socket 3, and a contact 9 are electrically connected with a not-illustrated measuring device, and thereby electrical characteristics are measured.

FIGS. 8A and 8B are enlarged views of the portion A in FIG. 7, in which FIG. 8A shows a case when the lead 4 and socket pin 5 are present at the continuous-line position and FIG. 8B shows a case when the same are present at the alternate-long-and-short-dash-line position.

Solder residue 10 is solder deposited on the socket pin 5 when the lead 4 is set to the socket pin 5 as shown in FIG. 8A, which solder was used for solder-plating the surface of the lead 4 of the IC package 1 in a previous step.

In the conventional IC-package measuring method described above, however, the deposited solder residue 10 is shaved off at the distal end of the lead 4 as shown in FIG. 8B during the stroke of the socket pushing distance B.

The shaved-off solder residue 10 attaches to the surface of the lead 4 or between a plurality of the leads 4 to cause a problem that the IC package 1 is mis-measured and the operating rate of the measuring device is lowered.

SUMMARY OF THE INVENTION

To solve the above problem, the present invention measures electrical characteristics by bringing a measuring pin of a measuring arm of a measuring socket into contact with an end surface of a distal end of a lead of a semiconductor package.

In accordance with the present invention, because electrical characteristics are measured by bringing the measuring pin into contact with an end surface of the distal end of the lead, no solder residue is produced and thus IC packages are not mis-measured and the operating rate of the measuring device is improved.

BRIEF DESCRIPTION OF THE DRAWINGS

FIGS. 6A and 6B are views showing a third embodiment of the present invention.

DETAILED DESCRIPTION OF THE PREFERRED EMBODIMENTS

Figure 1:
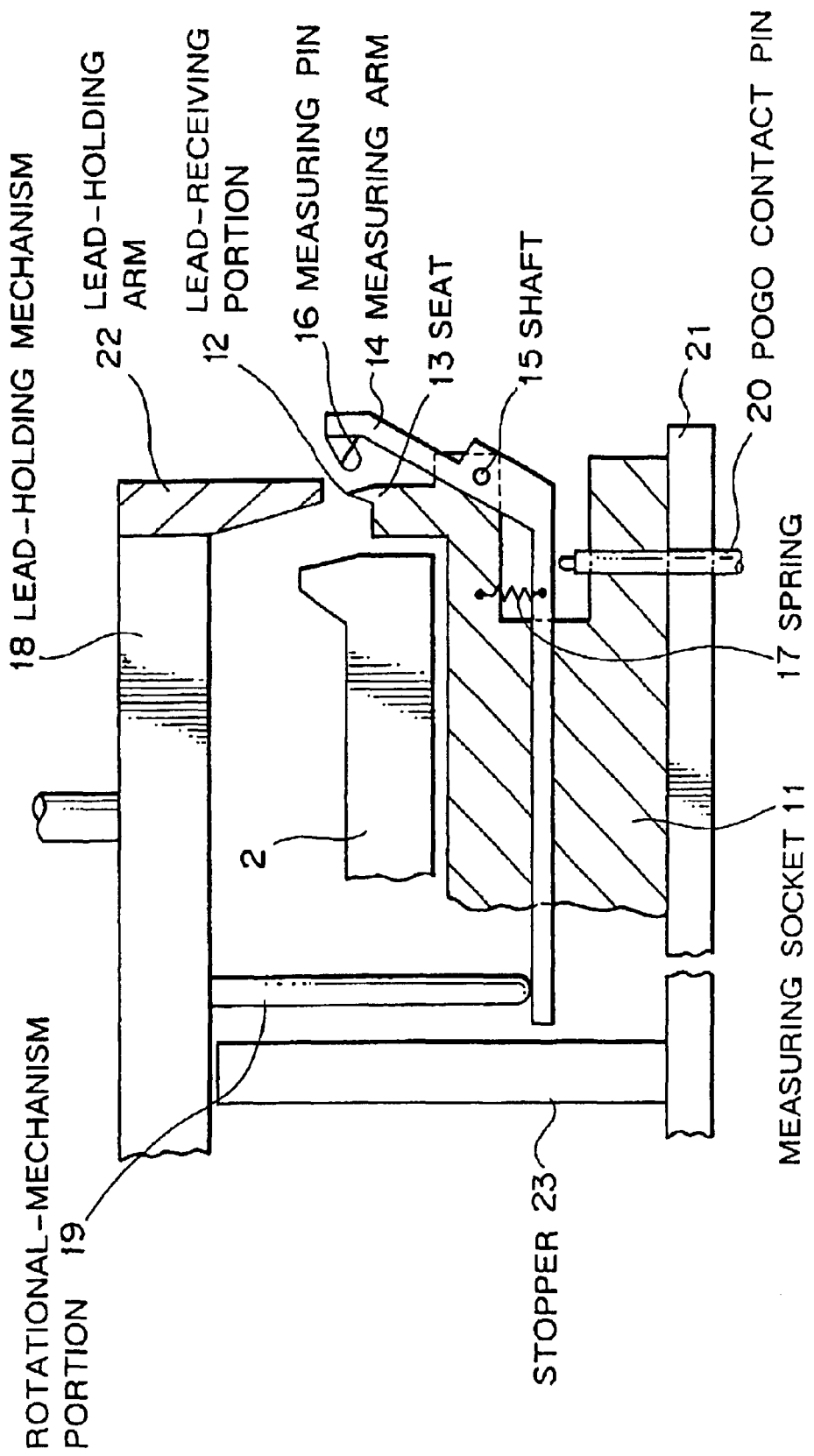
FIG. 1 is a view showing a first embodiment of the present invention.

FIG. 1 is a view showing the first embodiment of the present invention, and is a schematic sectional view of a principal portion including a measuring socket viewed from the side.

A seat 13 provided with a lead-receiving portion 12, for receiving by point contact a bottom of a distal end of a lead of an IC package such as a semiconductor package, is provided at an end of a measuring socket 11 made of synthetic resin.

A distal end of the lead-receiving portion 12 is formed as a point, and the lead-receiving portions 12 (sockets to be electrically connected with measuring sockets for measurement) corresponds to a number of leads to be tested.

Moreover, measuring arms 14 corresponding to the number of leads to be measured are linearly arranged near the seat 13 and are rotatably supported by a shaft 15.

The measuring arm 14 is formed of a conductive material in a gentle L-shape as a whole, a hole is formed near a central portion of the arm 14, and the insulator shaft 15 is passed through the hole.

A convex measuring pin 16 such as a pin having an acute-angular distal end is formed at one end of the measuring arm 14. When the lead-receiving portion 12 receives a lead, the distal end of the measuring pin 16 is positioned so as to line-contact at a central portion of an end surface of the lead in the thickness direction thereof.

Moreover, the measuring arm 14 is constantly urged by a spring 17 such that the measuring pin 16 is kept separate from the distal end of the lead.

A rotational-mechanism portion 19 provided at a lead-holding mechanism 18 of the measuring device contacts another end of the measuring arm 14. When a distal end of the rotational-mechanism portion 19 presses the other end of the measuring arm 14 downward, the measuring arm 14 rotates against the spring 17 with the shaft 15 serving as a fulcrum.

A portion of the measuring arm 14 extended toward the other end of the arm 14 from a portion slightly separate from the shaft 15 of the arm 14 is formed to have a certain angle, and a contact such as a POGO contact pin 20 is embedded in the measuring socket 11 and a board 21 under this portion of the measuring arm 14.

POGO contacts 20 equal to the number of measuring arms 14 are linearly arranged such that the bottom of each measuring arm 14 contacts and electrically connects with the head of each POGO contact pin 20.

The POGO contact pin 20 is connected to a measuring device used to measure an electrical characteristic of the IC package, and it is also possible to apply a contact probe to the pin 20.

A lead-holding arm 22 made of an insulating material is set at the lead-holding mechanism 18. The lead-holding arm 22 is constituted so as to move downward, hold the distal end of the lead of the IC package mounted on the test tray 2 together with the lead-receiving portion 12 of the seat 13, and further move downward, while holding the lead, to an upper side of a stopper 23 set at the board 21.

Figure 2:
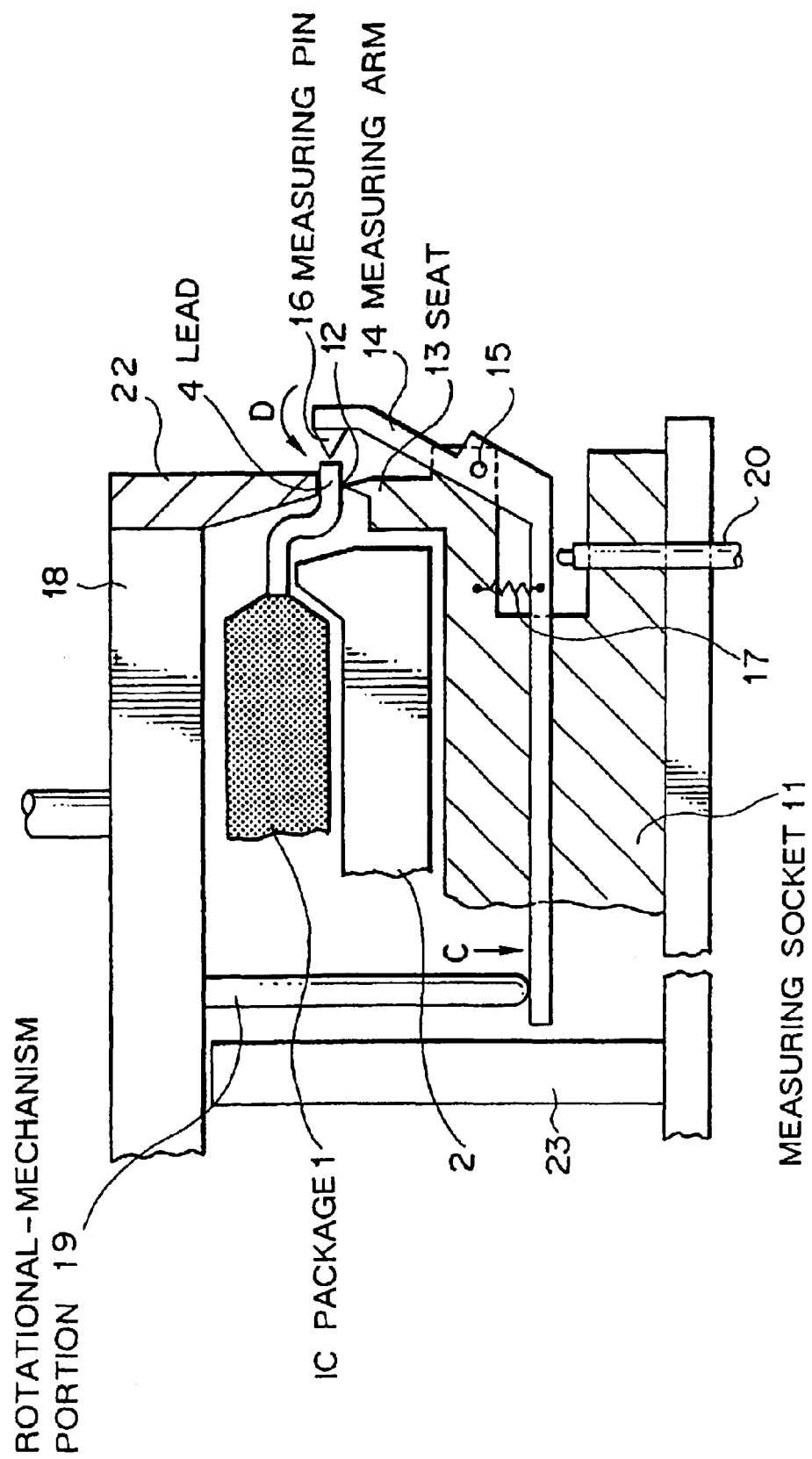
FIG. 2 is a view showing a measuring method of the first embodiment.

FIG. 2 is a view showing a measuring method of the first embodiment, and is a schematic sectional view of a principal portion of the measuring socket and the like to which the IC package is set, viewed from the side.

The test tray 2 on which the IC package 1 is mounted is transported by a not-illustrated transporting mechanism and the IC package 1 is set to an inspection position at which the measuring socket 11 is disposed. In this case, the distal end of the lead 4 of the IC package 1 is positioned to a position corresponding to the measuring pin 16.

Then, the lead-holding mechanism 18 lowers from the upper side, the distal end of the lead 4 is held by the lead-receiving portion 12 of the seat 13 formed at the measuring socket 11 and the lead-holding arm 22, and the lead-holding mechanism 18 further lowers, while holding the distal end of the lead 4, to the upper side of the stopper 23.

At this time, the distal end of the lead 4 point-contacts the lead-receiving portion 12.

When the lead-holding mechanism 18 lowers, the rotational-mechanism portion 19 lowers in the direction of arrow C to press the end of the measuring arm 14 opposite to the end thereof at which the measuring pin 16 is formed.

Then, the measuring arm 14 rotates in the direction of arrow D against the spring 17, using the shaft 15 as a fulcrum, and the measuring pin 16 perpendicularly contacts the end surface of the distal end of the lead 4. The pointed distal end of the measuring pin 16 line-contacts the central portion of the section of the lead 4 in the thickness direction thereof.

When the measuring arm 14 rotates, the bottom of the measuring arm 14 contacts the POGO contact pin 20, the lead 4 of the IC package 1 and the POGO contact pint 20 are electrically connected through the measuring pin 16 and measuring arm 14, and electrical characteristics of the IC package 1 are measured by a measuring device connected with the POGO contact pin 20.

At this time, the measuring pin 16 contacts the end surface of the distal end of the lead 4. However, the lead 4 was cut by individual-piece punching after solder-plating of the lead 4, and thus no solder remains on the end surface and no solder is transferred (attached) to or deposited on the measuring pin 16.

Moreover, because the lead-receiving portion 12 of the synthetic-resin seat 13 receives the distal end of the lead 4 by point contact, no solder is attached to the seat 13.

As described above, according to the first embodiment, because electrical characteristics are measured by bringing the measuring pin 16 into contact with the end surface of the distal end of the lead 4, no solder is attached to or deposited on the measuring pin 16 and no solder residue is produced.

Therefore, no solder residue attaches to the surface of the lead 4 or between the leads 4, no IC package 1 is mis-measured, and it is possible to improve the operating rate of a measuring device.

Figure 3:
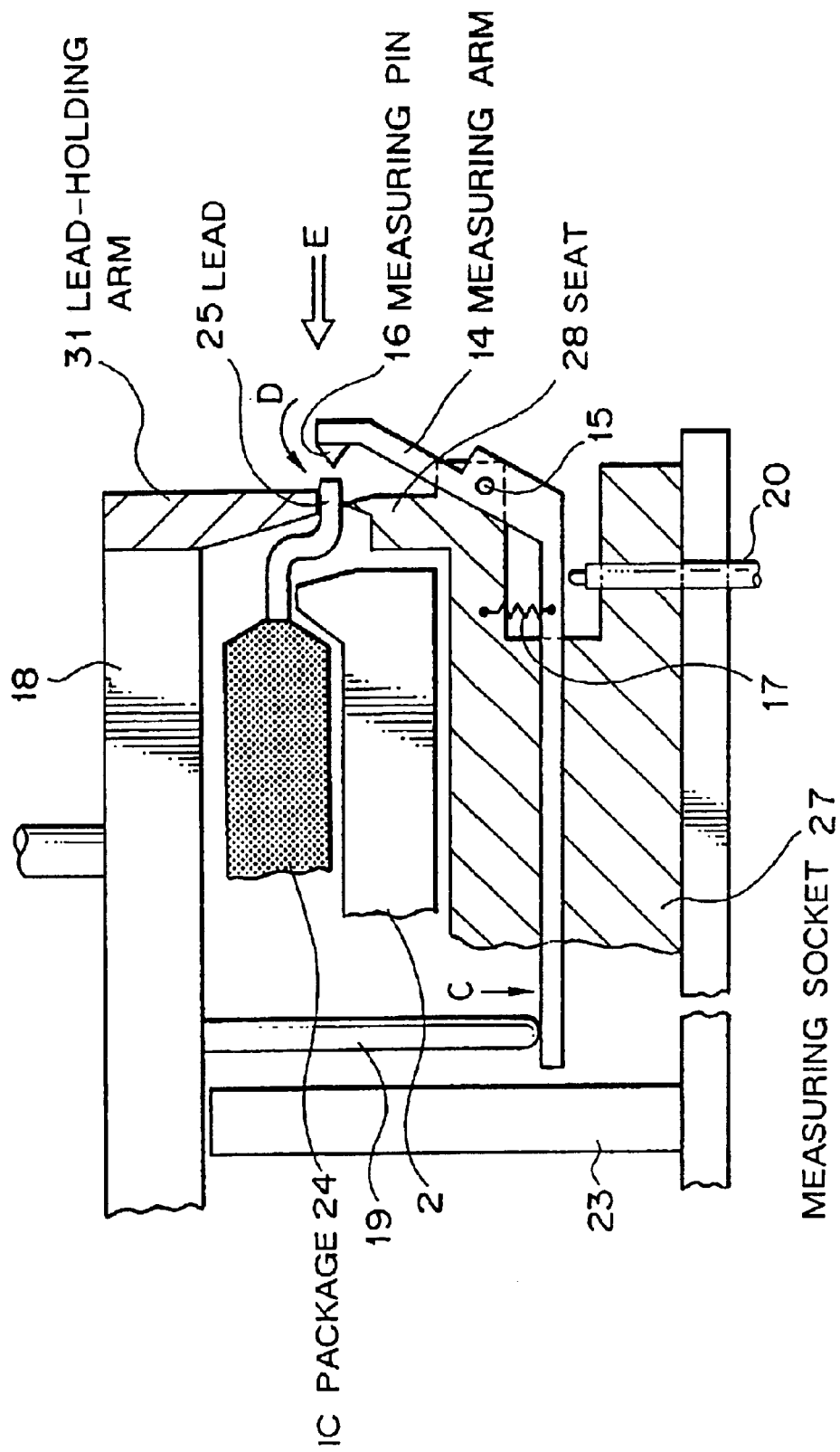
FIG. 3 is a view showing a second embodiment of the present invention.

FIG. 3 is a view showing the second embodiment of the present invention, and is a schematic sectional view of a principal portion of a measuring socket and the like at which an IC package is set, viewed from the side.

Figure 4:
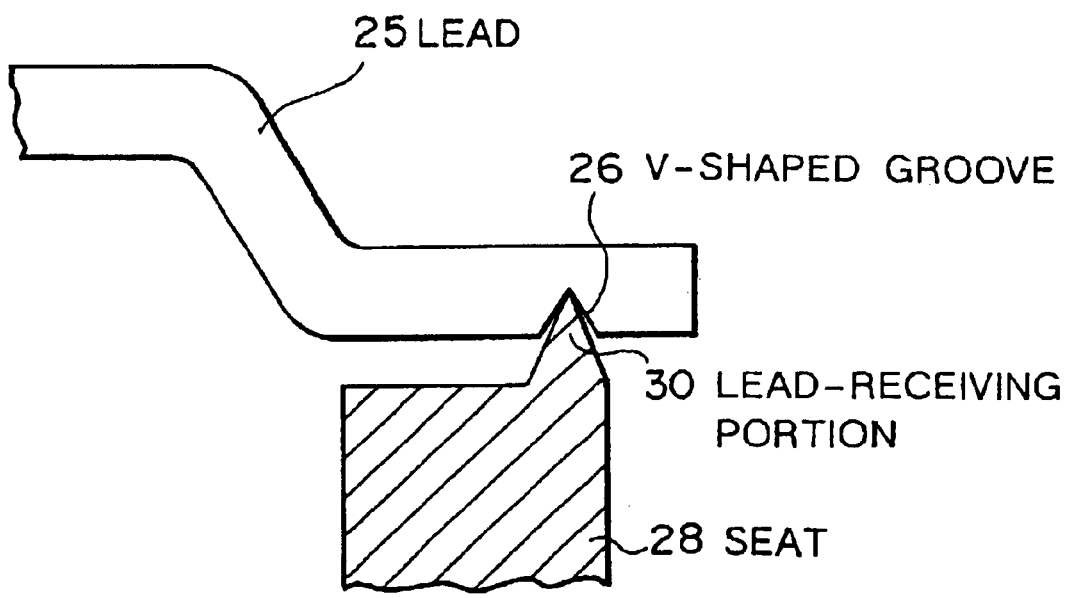
FIG. 4 is an enlarged view of the distal end of a lead.
Figure 5:
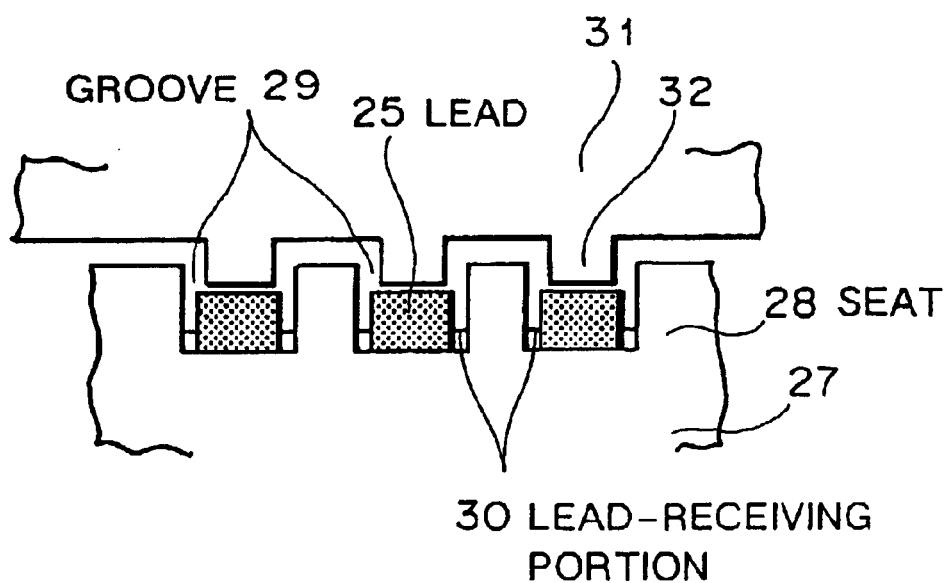
FIG. 5 is a side view of a measuring socket of the second embodiment of the present invention viewed from the direction of the arrow E in FIG. 3.
Figure 7:
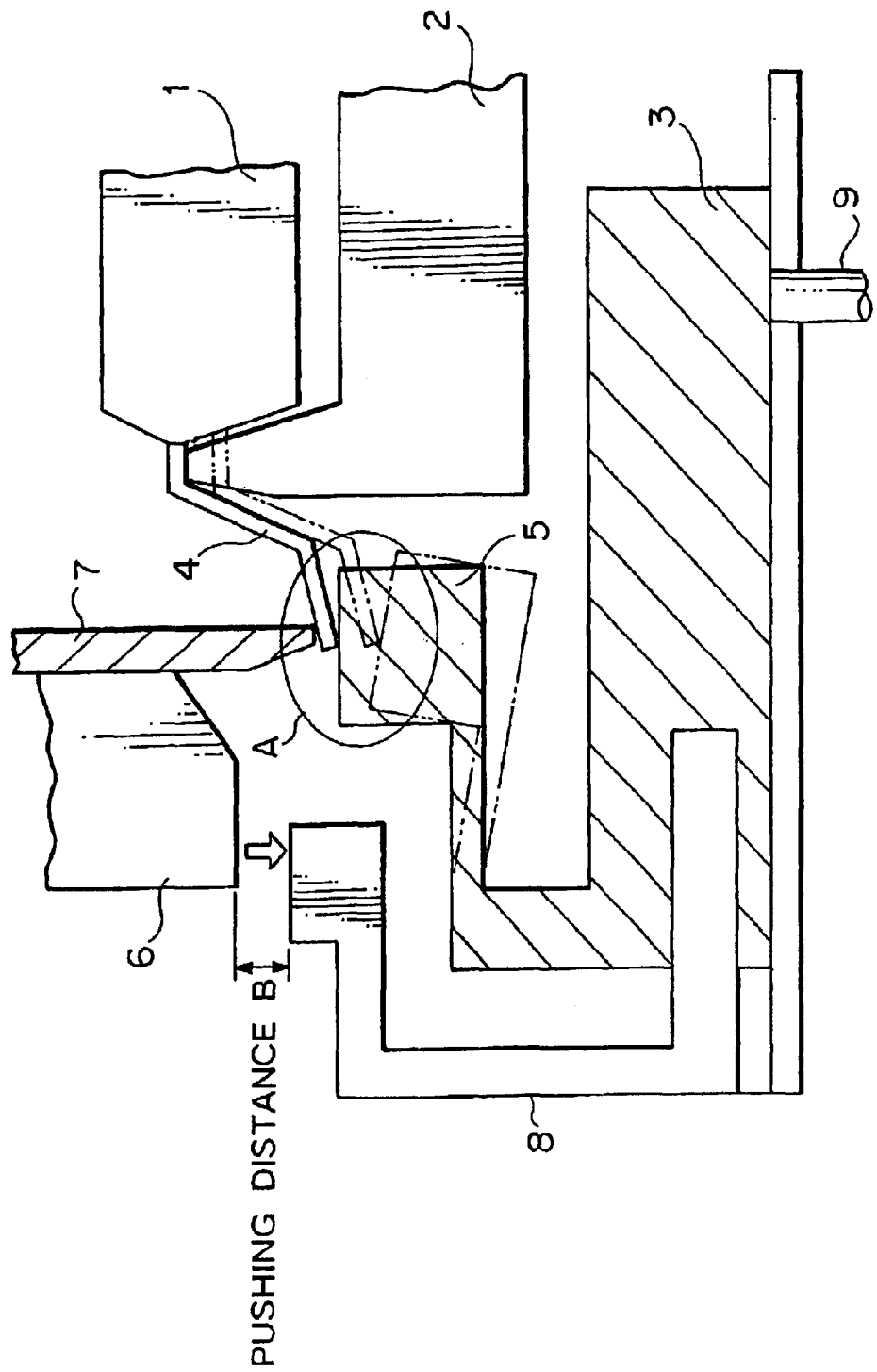
FIG. 7 is a view showing a conventional IC-package measuring method.
Figure 8B:
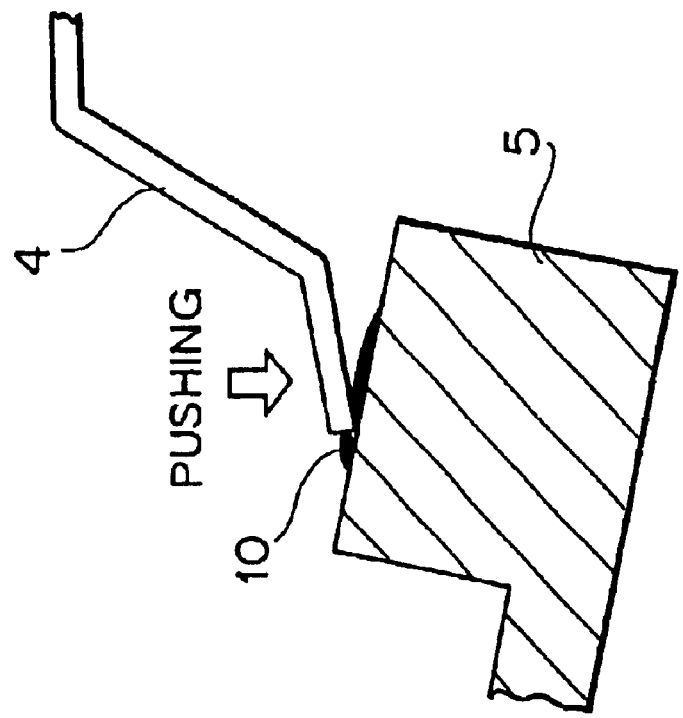
FIGS. 8A and 8B are enlarged views of portion A of FIG. 7.
Figure 8A:
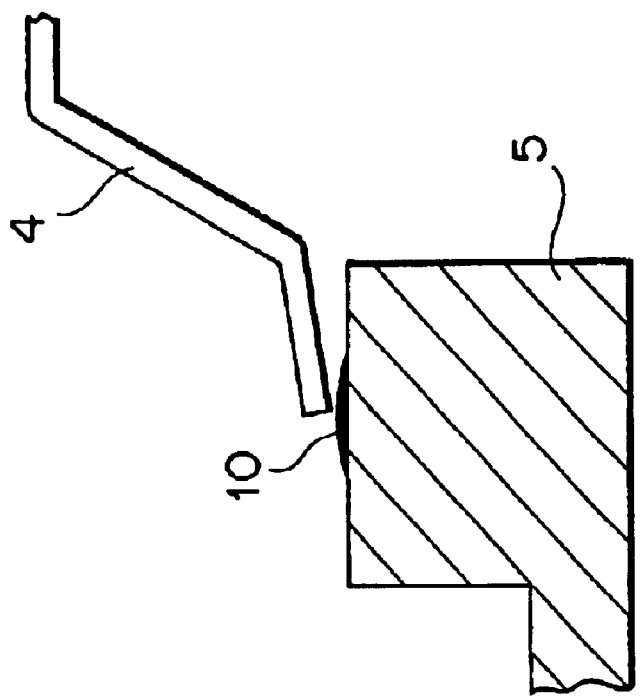

FIG. 4 is an enlarged sectional view of a distal end of a lead of an IC package and FIG. 5 is a side view of the second embodiment in FIG. 3, viewed from the direction of arrow E, in which view measuring arms are omitted.

As shown in FIG. 4, a V-shaped groove 26 is formed at the bottom of the distal end of a lead 25 of an IC package 24.

As shown in FIG. 5, concave grooves 29 respectively having a width into which the lead 25 can be inserted and corresponding to the number of the leads 25 are formed in a seat 28 formed at an end of a measuring socket 27.

A lead-receiving portion 30 whose cross section is formed into an acute angle is set in the groove 29. As shown in FIG. 4, the lead-receiving portion 30 engages and line-contacts with the V-shaped groove 26 formed at the bottom of the distal end of the lead 25.

As shown in FIG. 5, a distal end 32 of a lead-holding arm 31 of the lead-holding mechanism 18 is formed into a convex shape so as to correspond to the concave shape of the groove 29 of the seat 28 and functions so as to hold the distal end of the lead 25 by the lead-receiving portion 30 and the distal end 32.

Other structures are the same as those of the first embodiment, and the measuring method is the same as in the first embodiment except that the distal end of the lead 25 is held by the convex distal end 32 of the lead-holding arm 31 and the lead-receiving portion 30 of the seat 28, and the V-shaped groove 26 of the lead 25 engages with the lead-receiving portion 30. Therefore, descriptions of the other structures are omitted.

According to the second embodiment as described above, in addition to the advantages of the first embodiment, the lead 25 is prevented from bending toward an the IC package side when the measuring pin 16 is pressed and the measuring arm 14 is rotated to bring the pin 16 into contact with an end surface of the lead 25, because a pressure applied to the distal end of the lead 25 is controlled by the V-shaped groove 26 and lead-receiving portion 30.

FIGS. 6A and 6B are views showing the third embodiment of the present invention, and FIG. 6A is a top view of the IC package and FIG. 6B is an enlarged top view of a portion F in FIG. 6A at which portions of a seat and a measuring pin are added.

A distal end of a lead 34 of an IC package 33 is cut when the distal end of the lead is worked after solder-plating. An end surface of the distal end is formed into a concave shape such as the V-shape shown in FIG. 6B.

Moreover, a measuring pin 35 of the measuring arm is formed into a convex shape such as a reversed V-shape so as to engage an end surface shape of the distal end of the lead 34.

Other structures are the same as those of the second embodiment.

When the distal end of the lead 34 of the IC package 33 is set at a lead-receiving portion 30 of the seat 28, the same as in the second embodiment, a reversed V-shaped portion of the measuring pin 35 contacts a V-shaped portion formed in the end surface of the distal end of the lead 34 and is pressed to be electrically connected, and electrical characteristics of the IC package 33 are measured.

Thus, by forming the end surface of the distal end of the lead 34 into a concave shape and the distal end of the measuring pin 35 into a reversed V-shape, a position of the lead 34 is corrected by the distal end of the measuring pin 35 even if the IC package 33 is slightly shifted from a predetermined inspecting position while it is transported.

Moreover, because no solder is present on the end surface of the distal end of the lead 34, no solder residue is produced.

According to the third embodiment as described above, in addition to the effect of the second embodiment, because the shape of the end surface of the distal end of the lead 34 and that of the distal end of the measuring pin 35 are formed so that they are easily engaged with each other, a position of the lead 34 is corrected by the distal end of the measuring pin 35 and the lead 34 thereby securely contacts the measuring pin 35 and proper measurement can be performed.

What is claimed is:

1. An integrated circuit package, comprising:
    a semiconductor package; and
    at least one lead extending from said semiconductor package, and having opposing upper and lower surfaces, and a distal end surface that is essentially perpendicular to the upper and lower surfaces, the lower surface having a V-shaped groove formed therein at a distal end of the lead, wherein the V-shaped groove extends in a direction from one lateral side of said lead to an opposing lateral side of said lead, and is adapted to engage with a lead-receiving portion which is formed at a seat of a semiconductor package measuring socket, and the lead receiving portion has an acute angular cross section.

2. The integrated circuit package recited in claim 1, wherein the distal end surface of the lead is formed into a concave shape in a vertical direction so as to be adapted to engage with a measuring pin formed at a measuring arm of the semiconductor package measuring socket.

3. The integrated circuit package recited in claim 2, wherein the measuring pin has a convex cross section in the vertical direction.

4. The integrated circuit package recited in claim 2, wherein the measuring pin has an angular cross section in a horizontal direction.

5. The integrated circuit package recited in claim 1, wherein the at least one lead comprises a plurality of leads, each having a V-shaped groove formed in a lower surface at a distal end thereof.

6. The integrated circuit package recited in claim 5, wherein the seat has recessed grooves equal in number to a number of the leads, each recessed groove having a respective lead-receiving portion formed therein, each lead-receiving portion having an acute angular cross section, each V-shaped groove of each lead being adapted to engage with a respective lead-receiving portion.

7. The integrated circuit package recited in claim 5, wherein the distal end surface of each lead is formed into a concave shape in a vertical direction to be adapted to engage with a respective measuring pin formed at a respective measuring arm of the semiconductor package measuring socket.

8. An integrated circuit package, comprising:
    a semiconductor package; and
    at least one lead extending from said semiconductor package, and having opposing upper and lower surfaces, and a distal end surface that is essentially perpendicular to the upper and lower surfaces, the distal end surface being formed into a concave shape, from the upper surface to the lower surface and in a vertical direction to be adapted to engage with a measuring pin formed at a measuring arm of a semiconductor package measuring socket, the measuring pin having a convex cross section in the vertical direction,
    wherein the lead has a V-shaped groove formed in the lower surface at a distal end thereof, and wherein the V-shaped groove is adapted to engage with a lead-receiving portion which is formed at a seat of the semiconductor package measuring socket.

9. The integrated circuit package recited in claim 8, wherein the lead receiving portion has an acute angular cross section.

10. An integrated circuit package, comprising:
    a semiconductor package; and
    at least one lead extending from said semiconductor package, and having opposing upper and lower surfaces, and a distal end surface that is essentially perpendicular to the upper and lower surfaces, the distal end surface being formed into a concave shape, from the upper surface to the lower surface and in a vertical direction to be adapted to engage with a measuring pin formed at a measuring arm of a semiconductor package measuring socket, the measuring pin having a convex cross section in the vertical direction,
    wherein the at least one lead comprises a plurality of leads, each having a distal end surface formed into a concave shape in the vertical direction.

11. The integrated circuit package recited in claim 10, wherein each lead has a V-shaped groove formed in its lower surface at a distal end thereof, wherein each V-shaped groove is adapted to engage with a respective lead-receiving portion which is formed at a seat of the semiconductor package measuring socket, and the lead receiving portion has an acute angular cross section; and wherein the seat has recessed grooves equal in number to a number of the leads, each recessed groove having a respective one of the lead-receiving portions formed therein, each V-shaped groove of each lead being adapted to engage with a respective one of the lead-receiving portions.

12. The integrated circuit package recited in claim 10, wherein the distal end surface of each lead is adapted to engage with a respective measuring pin formed at a respective measuring arm of the semiconductor package measuring socket, each measuring pin having a convex cross section in the vertical direction.

* * * * *